US008210840B2

(12) United States Patent
Shilpickandula et al.

(10) Patent No.: US 8,210,840 B2
(45) Date of Patent: Jul. 3, 2012

(54) DIAPHRAGM FLEXURE WITH LARGE RANGE AND HIGH LOAD CAPACITY

(75) Inventors: Vijay Shilpickandula, Cambridge, MA (US); Kamal Youcef-Toumi, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 288 days.

(21) Appl. No.: 12/425,647

(22) Filed: Apr. 17, 2009

(65) Prior Publication Data

US 2009/0260213 A1    Oct. 22, 2009

Related U.S. Application Data

(60) Provisional application No. 61/045,693, filed on Apr. 17, 2008, provisional application No. 61/049,789, filed on May 2, 2008.

(51) Int. Cl.
    *B29C 59/00* (2006.01)
(52) U.S. Cl. .................................. 425/385; 264/293
(58) Field of Classification Search .................. 425/385; 264/293
    See application file for complete search history.

(56) References Cited

U.S. PATENT DOCUMENTS

| | | | |
|---|---|---|---|
| 6,696,220 B2 * | 2/2004 | Bailey et al. | 425/385 |
| 7,348,709 B2 | 3/2008 | Xu | |
| 7,789,653 B2 * | 9/2010 | Iimura et al. | 425/385 |
| 2004/0022888 A1 | 2/2004 | Sreenivasan et al. | |
| 2004/0149687 A1 | 8/2004 | Choi et al. | |
| 2007/0261574 A1 | 11/2007 | Kendale et al. | |

FOREIGN PATENT DOCUMENTS

WO      2006061255      6/2006

OTHER PUBLICATIONS

Chen et al., Design of an Ultra Precision Diaphragm Flexure Stage for Out-of-Plane Motion Guidance: Proceedings of DETC 2004-57401, ASME 2004.

* cited by examiner

*Primary Examiner* — Maria Veronica Ewald
(74) *Attorney, Agent, or Firm* — Gesmer Updegrove LLP

(57) ABSTRACT

A stamping structure for imprinting micro-sized features is provided. The stamping structure includes a flexure arrangement having one or more diaphragm flexures arranged in a series or parallel or hybrid configuration so as to manage load-capacity while still achieving adequate vertical and angular range of a sample supported on the one or more diaphragm flexures.

14 Claims, 5 Drawing Sheets

| Application | | Pattern transfer via Stamping | Small-scale gaps | Comments |
|---|---|---|---|---|
| Vertical positioning | Range (coarse) | 3 in | 3 in | For sample loading |
| | Range (fine) | 0-400 μm (Closing the gap from a large initial opening) | 100 nm-10 μm (Controlling the gap height to a set value) | Range for stamping includes initial travel and channel depth. |
| | Resolution | ~10 nm | ~nm | Finer resolution required in small-scale gaps to dial in any desired height. |
| | Bandwidth | 100 Hz-1KHz | 100 Hz-1KHz | Faster bandwidth allows for less cycle times |
| Angular (pitch and roll) Alignment | Range (coarse) | 100 mrad | 100 mrad | Use coarse adjustments, for e.g. with spacers. |
| | Range (fine) | 1-5 mrad | 1-5 mrad | |
| | Resolution | ~sub μrad | ~sub μrad | |
| | Bandwidth | 100 Hz-1KHz | 100 Hz-1KHz | Faster bandwidth allows for less cycle times. |
| Load: Force | | 10 kN (5MPa on 75mm x 25mm area) | 0.63 kN (1 MPa on 25 mm x 25 mm area) | |
| Load: Thermal | | 200°C | Not significant | Use symmetry, use Thermal cooling system. |

FIG. 1

$$F_{tmax} = \frac{1}{6} \frac{bH^2}{L} \sigma_{YIELD}$$

$$F_{max} \sim \frac{2}{3} \frac{bh^2}{L} \sigma_{YIELD}$$

$$F_{max} \sim \frac{4}{3} \frac{bh'^2}{L} \sigma_{YIELD}$$

| | Blade Flexure | Parallelogram Flexure | Double Parallelogram flexure |
|---|---|---|---|
| Stiffness | K | K/4 | K/22.6 |
| Vertical Range | δ | 4 δ | 22.6 δ |

DIAPHRAGM FLEXURE WITH LARGE RANGE AND HIGH LOAD CAPACITY

PRIORITY INFORMATION

This application claims priority from provisional application Ser. No. 61/045,693 filed on Apr. 17, 2008, and provisional application Ser. No. 61/049,789 filed on May 2, 2008, both of which are incorporated herein by reference in their entireties.

BACKGROUND OF THE INVENTION

The invention is related to the field of nanomanufacturing, and in particular to the design and control of flexure-based mechanisms for positioning/fixturing and angular alignment for pattern transfer via stamping and small-scale gap applications in nano manufacturing.

Micro-hot-embossing is a commonly used forming process for polymers. This process involves stamping a patterned tool into a polymer sample to form functional microfluidic channels. A typical stamping cycle includes heating of the polymer sample to high temperatures (above the glass transition temperature), in some cases, up to 200° C. and applying large pressures on the order of 5-10 MPa. Pitch and roll angular misalignment between tool and sample during the stamping procedure can result in errors such as non-uniform depths of the transferred patterns. The non-uniform feature dimensions can critically affect flow rates for the end-user, e.g. a biologist using the microfluidic device.

As an example, in an embossing application requiring 10 µm deep channels to be formed over a 75 mm×25 mm area, a 0.001° (17.4 microradian) tool-sample angular misalignment can result in a 13% variation of depth across the 75 mm lateral span. Assuming other variations are held constant, this height variation corresponds to about a 39% variation in the flow rate across the polymer part, using a simplified Poiseuille flow approximation in the channels. Such a flow rate variation is unacceptable for many precise flow control applications, e.g. microfluidic devices designed for controlled drug delivery.

There are many other exciting applications that require precision positioning and angular (pitch and roll) alignment on a small-scale. Consider, for example, a small gap formed as a separation between two large-area (25 mm×25 mm) optically flat and smooth surfaces, and programmed to vary in the range of 100 nm to 10 µm. Many designs of variable gaps formed between two optically flat and smooth surfaces have been reported. However, none of them address achieving precise parallelism in a plane-on-plane geometry, for example, with flat planar surfaces, and forming the gap at heights of about 100 nm to 10 µm. While coarse adjustments can correct for large initial misalignment between the surfaces, the invention is interested in fine adjustments at a range of ~mrad, and incremental resolution of sub-µrad for achieving precise parallelism.

SUMMARY OF THE INVENTION

According to one aspect of the invention, there is provided a stamping structure for imprinting micro-sized features. The stamping structure includes a flexure arrangement having one or more diaphragm flexures arranged in a series or parallel or hybrid configuration so as to manage load-capacity while still achieving adequate vertical and angular range of a sample supported on the one or more diaphragm flexures.

According to another aspect of the invention, there is provided a method of forming a stamping structure for imprinting micro-sized features. The method includes providing one or more diaphragm flexures. Also, the method includes arranging the one or more diaphragm flexures in a series or parallel or hybrid configuration so as to manage load-capacity while still achieving adequate vertical and angular range of a sample supported on the one or more diaphragm flexures.

BRIEF DESCRIPTION OF THE DRAWINGS

FIG. 1 is a table illustrating functional requirements for precision positioning and alignment for stamping and small-scale gap applications;

DETAILED DESCRIPTION OF THE INVENTION

The invention provides a design and control of flexure-based mechanisms for positioning/fixturing and angular alignment for (i) pattern transfer via stamping and (ii) small-scale gap applications in micro/nano manufacturing. As will be explained hereinafter, existing designs do not address some critical functional requirements identified for the applications of interest. The invention works toward new concepts and designs that one can implement and test.

The invention focuses in positioning and aligning a tool and sample, or two optical flats, in their degrees of freedom (DOF) (z vertical, $\theta_x$ pitch and $\theta_y$ roll) while satisfying the following functional requirements given in Table 10 of FIG. 1. The constrained motions are x (lateral), y (lateral), and $\theta_z$ (yaw). Moreover, the invention uses parallel kinematics with actuator isolation, minimal cross-axis motion errors (e.g. errors in $\theta x$ or $\theta y$ when z is actuated), and minimal parasitic error motions (e.g. errors in x when z is actuated).

Figure 2:
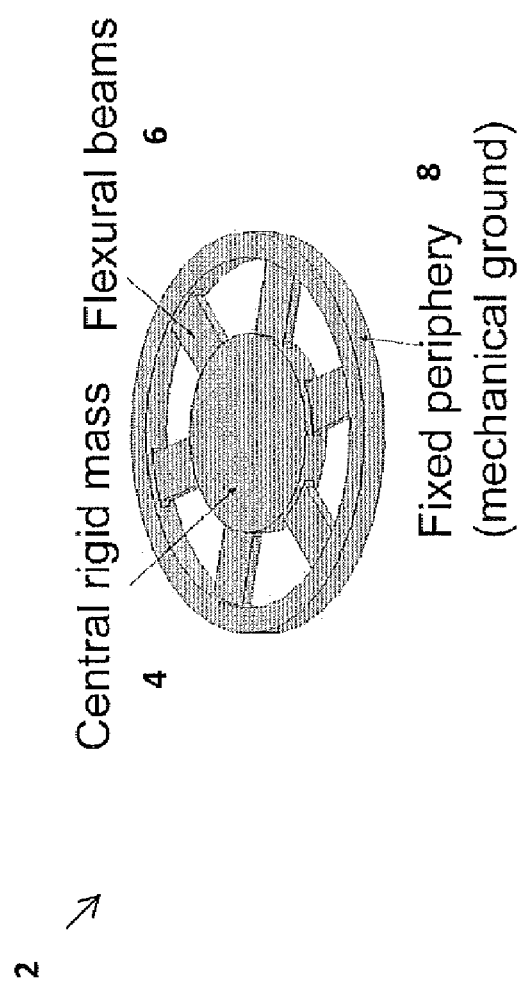
FIG. 2 is schematic diagram illustrating a diaphragm flexure allowing for three degrees of freedom (DOF) for a tool or sample fixed to its central rigid mass.

Precise vertical guidance and angular alignment between the tool and sample, or between two optical flats, can be achieved by using flexure-based mechanisms since they ensure smooth elastic motion without friction or backlash. One such mechanism is the diaphragm flexure mechanism 2, shown schematically in a radial beam configuration in FIG. 2. In particular, FIG. 2 shows a diaphragm flexure arrangement 2 allowing for three DOF for a tool or sample fixed to its central rigid mass 4 using a fixed periphery 8. The DOFs are deflection (perpendicular to the plane of the mass), and pitch and roll (about any two perpendicular axes in the plane of the mass). A diaphragm flexure 2 with radially oriented beams 6 is shown; the concepts presented here apply to diaphragm flexures composed of tangential or curved beams as well.

However, existing diaphragm flexure designs cannot meet the stringent load requirements of about 10 kN specified for micro-hot-embossing. Increasing the thickness of the flexural beams 6 can help improving the maximum load that can be sustained before failure. However, the increase in beam thickness comes with an increase in stiffness and a decrease in the overall deflection possible with the mechanism. Low deflections indicate limited range of travel and hence the depths of microfluidic channels embossed into the polymer in a microhot-embossing process. On the other hand, without increasing the beam thickness, it is possible to improve on the load capacity and stiffness through the design described below.

Figures 3A, 3B:
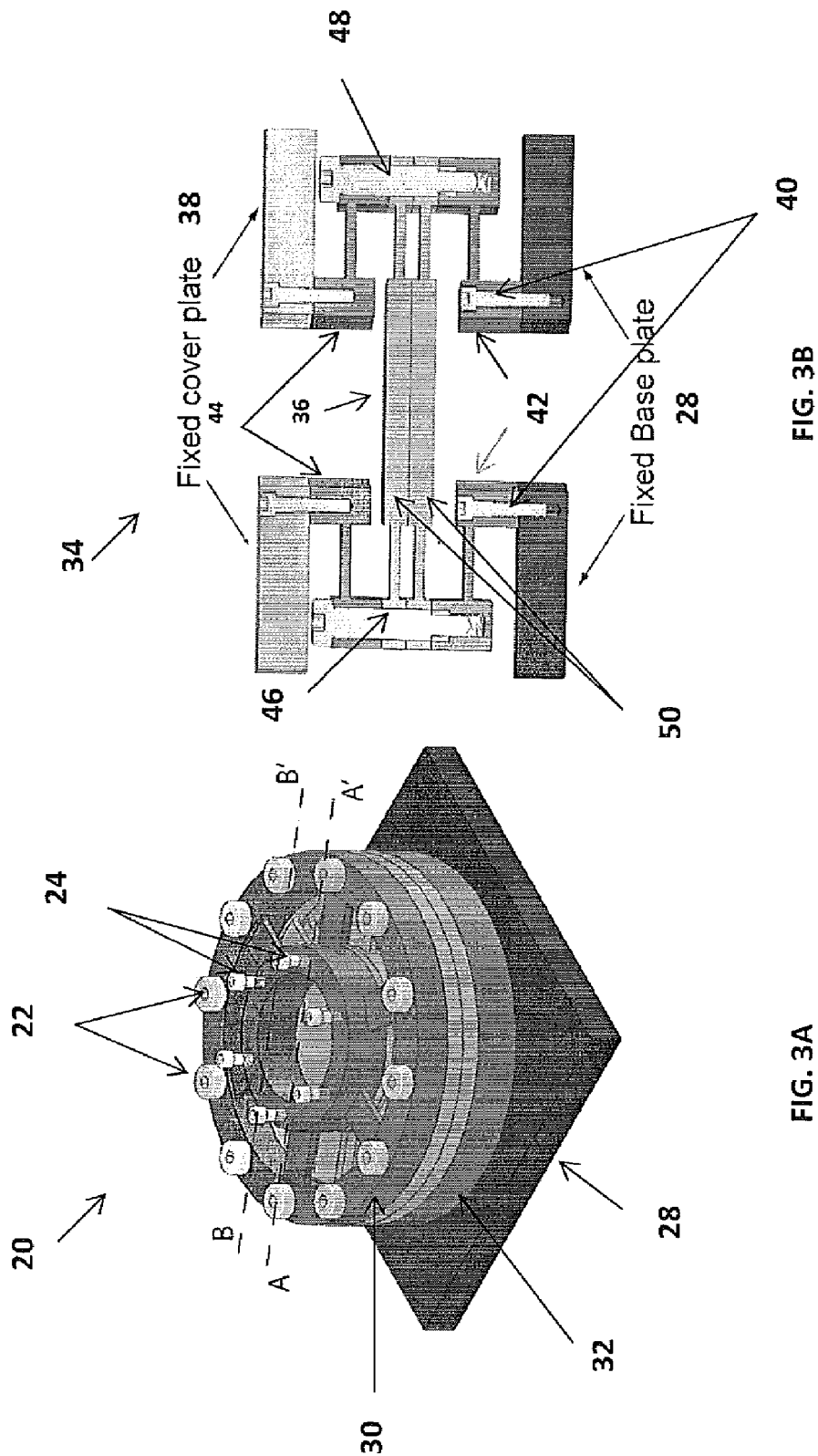
FIG. 3A is schematic diagram illustrating the inventive flexure-based arrangement and FIG. 3B is a schematic diagram illustrating a cross-sectional view of the flexure-based arrangement.

A schematic diagram of the inventive diaphragm flexure arrangement 20 is shown in FIG. 3A. This diaphragm flexure arrangement 20 includes a stack of diaphragm flexure structure 34 formed in a double-parallelogram flexure configuration 36 revolved about the central axis. A head-on view of the volume slice AA'B'B is shown FIG. 3B. Note FIG. 3B show a single diaphragm flexure structure but the diaphragm flexure arrangement 20 includes a plurality of such diaphragm flexure structures 34. Also, for purposes of clarity FIG. 3A does not show a cover layer 38.

The inventive diaphragm flexure arrangement 20 can be designed, for example, to position and align a sample in a micro-hot-embossing setup. When a tool guided, for example by a hydraulic press, comes into contact with the sample, the sample will conform to the tool orientation during the embossing due to the inherent pitch and roll compliance of the mechanism. For the same load-capacity this mechanism is expected to have a larger range (vertical deflection and in turn, pitch and roll angular deflection) than a conventional diaphragm flexure.

A fixed base plate 28 and cover plate 40 can be fastened to the frame of the vertical press (e.g. an Instron press) to form a rigid structural ground using fasteners 22, 24. Also, fasteners 40 are used to couple the fixed base plate 28 to the diaphragm flexure structure 34. The diaphragm flexure structure 34 includes a number of rigid structures 42, 44 used to provide angular and vertical positioning to a double-parallelogram flexure configuration 36 having one or more flexure blades 50. The rigid structures 42, 44 and double-parallelogram flexure configuration 36 are coupled to supporting structures 46, 48 used in properly positioning the inventive flexure arrangement 20.

The effect of misalignments in the cover plate and any stresses induced in the flexural beams during abrasive water jet machining and subsequent assembly can be studied experimentally by monitoring the free response of the diaphragm with an interferometric displacement sensor. A liquid thermal cooling system can be included with an existing embossing setup on which this mechanism is being tested allows for preventing build up of large thermal (axial) stresses in the flexural mechanism.

The flexure arrangement 20 provides guidance and/or angular alignment without any friction, hysteresis, or creep non-linearities. The supporting structures 46, 48 can be coupled to one or more actuators for passive, semi-passive, or active techniques for guidance and/or angular alignment. The flexure arrangement 20 allows achieving parallelism between a tool and a sample. Also, the diaphragm flexure structure 34 can be arranged in a series or parallel or hybrid configuration so as to manage load-capacity while still achieving adequate vertical and angular range of a sample used by the stamping structure.

Figure 4A:
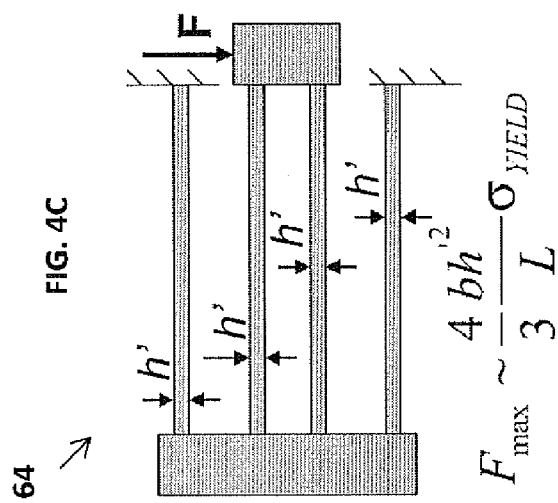
FIG. 4A-4C are schematic diagrams illustrating a blade flexure, a parallelogram or a double blade flexure, and a double-parallelogram flexure.
Figure 4B:
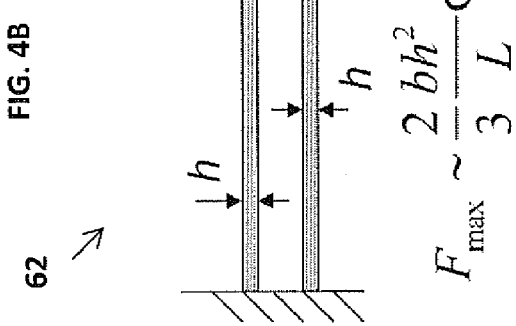
Figure 4C:
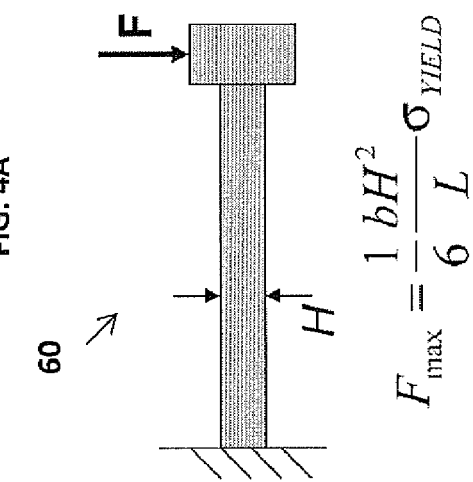

The use of a double parallelogram flexure as a constituent block in this design is based on a comparison between a simple blade flexure, a double blade flexure, and a double parallelogram flexure presented in FIGS. 4A-4C. FIG. 4A shows a blade flexure 60, FIG. 4B shows a parallelogram or double blade flexure 62, and FIG. 4C shows a double-parallelogram flexure 64. For these flexures, load capacities $F_{max}$ for each case is given in terms of width b into the plane of the page, the length L, and thicknesses H, h, and h', respectively. For the same load capacity, the double parallelogram flexure 64 has the largest range (deflection).

Figure 5:
FIG. 5 is a table illustrating stiffness and range comparison when designed for the same load-capacity.

For small deflections, one can develop lumped models using linear Euler-Bernoulli beam bending theory to estimate the load capacity, vertical deflection, and stiffness. The stiffness and vertical deflection (range) values for the three flexures 60, 62, 64 of FIGS. 4A-4B when designed for the same load capacity are given in Table 66 of FIG. 5.

The double parallelogram flexure 64 has the largest vertical deflection of the three flexures and is hence desirable. Since the inventive flexure arrangement is built based on the double parallelogram flexure, one can expect that it has about 20 times larger vertical (and angular) range as compared to the diaphragm flextire 2 of FIG. 2 designed to sustain the same load.

The diaphragm flexure design embodiments in FIG. 3A are obtained as a full solid of revolution of the unit double parallelogram flexure shown in FIG. 4C. A further improvement on this design is one in which the double parallelogram flexure units are localized in angular sectors around a central vertical axis, instead of a fill solid of revolution, as in FIG. 3A.

The invention can be used for both passive and actively controlled implementations that need vertical guidance and angular alignment. The invention can be used in fabricating and testing the flexure-based mechanism for use in passive alignment with a low-cost high-production micro-hot-embossing setup. In this setup, a pressurized pneumatic actuator is used to guide the tool attached at its end. The sample is mounted on the proposed design, which occupies a footprint circle of 8-inch diameter. By the rule of reciprocity, an equally acceptable arrangement is one with the tool supported on the flexure and pushing into a polymer sample fixed to a rigid ground. Arranging the flexure on the tool side relieves the load capacity requirement in the design since the force from the pneumatic actuator goes to a parallel combination of springs constituting the flexure and the polymer.

The error motions (parasitic) from this structure are expected to be low since the stiffness ratios for in-plane motion to out-of-plane motion are on the order of $(L/h')^2$ where h' is the beam thickness and L its length. An added benefit to the design is its modularity; stiffness or load-capacity can be tuned based on the number of beam layers included in the stack.

The following discussion is on active feedback control implementations around the proposed mechanism. Since the mechanism is designed to have parallel kinematics, three linear actuators, arranged in a non-collinear configuration, can be used to push down on the central rigid mass to actuate the 3 DOFs—vertical motion, pitch, and roll. In some embossing machines that are already provided with a vertical actuator, such as an Instron press, active feedback control of angular alignment can be achieved with actuators placed horizontally (orthogonal to the vertical load, and hence not in the load path). The horizontally placed actuators can push on a lever arm rigidly attached to the central rigid mass, causing it rotate from the generated moment. The longer the lever arm, the larger is the moment generated for a relatively smaller force. The limitation of this design is the increased inertia from having a lever arm and the resulting reduction in bandwidth. Design tradeoffs such as that between bandwidth and range need to be hence addressed in the implementation, based on the requirements of the end-application.

As for sensing, capacitive sensors that measure the displacement of the lever arm may be used in initial trials for feedback control. These sensors will be collocated with the piezoelectric actuators. The absolute reference or "zero reading" needed for the capacitive sensors can be obtained when the tool and sample are brought into complete contact with a preset amount of "over travel". This technique seems promising, but it is limited by the surface finish characteristics of the tool and sample since the zero reading is uncertain by the amount ΔS/L, where ΔS is the uncertainty in surface planarity and L is the lateral span of the mating surfaces. On the other hand, using the end-point feedback i.e. direct gap measurement with an optical sensor, such as a multiple-beam interferometer, may perform better in correcting for any angular misalignment errors. However, the resulting non-collocated arrangement is likely to pose heavy challenges on controller design.

Although the present invention has been shown and described with respect to several preferred embodiments thereof, various changes, omissions and additions to the form and detail thereof, may be made therein, without departing from the spirit and scope of the invention.

What is claimed is:

1. A stamping structure for imprinting micro-sized features comprising a flexure arrangement having one or more diaphragm flexures arranged in a series or parallel or hybrid configuration so as to manage load-capacity while still achieving adequate vertical and angular range of a sample supported on the one or more diaphragm flexures using parallel kinematics and actuator isolation to minimize cross-axis motion errors and parasitic motion errors, the one or more diaphragm flexures having a double-parallelogram flexure configuration revolving about a central axis where the flexure arrangement includes a plurality of rigid structures to provide angular and vertical positioning.

2. The stamping structure of claim 1, wherein said flexure arrangement provides guidance and/or angular alignment without any friction, hysteresis, or creep non-linearities.

3. The stamping structure of claim 1, wherein said flexure arrangement is coupled to one or more actuators for passive, semi-passive, or active techniques for guidance and/or angular alignment.

4. The stamping structure of claim 1, wherein said flexure arrangement is coupled to one or more sensors for semi-passive or active semi-passive or active techniques for guidance and/or angular alignment.

5. The stamping structure of claim 1, wherein said diaphragm flexures comprise parallelogram or double blade flexures.

6. The stamping structure of claim 1, wherein said diaphragm flexures comprise single blade flexures.

7. The stamping structure of claim 1, wherein said flexure arrangement achieving parallelism between said stamping structure and said sample.

8. A method of forming a stamping structure for imprinting micro-sized features comprising:
providing one or more diaphragm flexures;
arranging said one or more diaphragm flexures in a series or parallel or hybrid configuration so as to manage load-capacity while still achieving adequate vertical and angular range of a sample supported on the one or more diaphragm flexures using parallel kinematics and actuator isolation to minimize cross-axis motion errors and parasitic motion errors, the one or more diaphragm flexures having a double-parallelogram flexure configuration revolving about a central axis where the flexure arrangement includes a plurality of rigid structures to provide angular and vertical positioning.

9. The method of claim 8, wherein said one or more diaphragm flexures provide guidance and/or angular alignment without any friction, hysteresis, or creep non-linearities.

10. The method of claim 8, wherein said one or more diaphragm flexures are coupled to one or more actuators for passive, semi-passive, or active techniques for guidance and/or angular alignment.

11. The method of claim 8, wherein said one or more diaphragm flexures are coupled to one or more sensors for semi-passive or active semi-passive or active techniques for guidance and/or angular alignment.

12. The method of claim 8, wherein said one or more diaphragm flexures comprise double-parallelogram flexures.

13. The method of claim 8, wherein said diaphragm flexures comprise single blade flexures.

14. The method of claim 8, wherein said one or more diaphragm flexures achieving parallelism between said stamping structure and said sample.

* * * * *

UNITED STATES PATENT AND TRADEMARK OFFICE
CERTIFICATE OF CORRECTION

PATENT NO. : 8,210,840 B2  Page 1 of 1
APPLICATION NO. : 12/425647
DATED : July 3, 2012
INVENTOR(S) : Vijay Shilpiekandula et al.

It is certified that error appears in the above-identified patent and that said Letters Patent is hereby corrected as shown below:

On the Title page at item (12) and item (75): please correct the spelling of the first inventor's name to the following: Vijay Shilpiekandula Signed and Sealed this
Sixteenth Day of October, 2012

David J. Kappos
*Director of the United States Patent and Trademark Office*